United States Patent
Barry et al.

(10) Patent No.: US 9,273,391 B2
(45) Date of Patent: Mar. 1, 2016

(54) ALD OF ZIRCONIUM-CONTAINING FILMS USING CYCLOPENTADIENYL COMPOUNDS

(71) Applicant: ASM IP HOLDING B.V., Almere (NL)

(72) Inventors: Sean T. Barry, Ottawa (CA); Yamile A. M. Wasslen, Ottawa (CA); Antti H. Rahtu, Vantaa (FI)

(73) Assignee: ASM IP HOLDING B.V., Almere (NL)

( * ) Notice: Subject to any disclaimer, the term of this patent is extended or adjusted under 35 U.S.C. 154(b) by 13 days.

(21) Appl. No.: 14/311,154

(22) Filed: Jun. 20, 2014

(65) Prior Publication Data

US 2015/0017348 A1   Jan. 15, 2015

Related U.S. Application Data

(63) Continuation of application No. 11/588,595, filed on Oct. 27, 2006, now Pat. No. 8,795,771.

(51) Int. Cl.
| | |
|---|---|
| C23C 16/18 | (2006.01) |
| C23C 16/32 | (2006.01) |
| C23C 16/34 | (2006.01) |
| C23C 16/455 | (2006.01) |
| C23C 16/513 | (2006.01) |

(52) U.S. Cl.
CPC ............... *C23C 16/18* (2013.01); *C23C 16/32* (2013.01); *C23C 16/34* (2013.01); *C23C 16/45525* (2013.01); *C23C 16/45553* (2013.01); *C23C 16/513* (2013.01)

(58) Field of Classification Search
None
See application file for complete search history.

(56) References Cited

U.S. PATENT DOCUMENTS

| | | | |
|---|---|---|---|
| 4,058,430 | A | 11/1977 | Suntola et al. |
| 5,130,172 | A | 7/1992 | Hicks et al. |
| 5,149,596 | A | 9/1992 | Smith et al. |
| 5,300,321 | A | 4/1994 | Nakano et al. |
| 5,453,494 | A | 9/1995 | Kirlin et al. |
| 5,711,811 | A | 1/1998 | Suntola et al. |
| 6,475,276 | B1 | 11/2002 | Elers et al. |
| 6,586,792 | B2 | 7/2003 | Ahn et al. |

(Continued)

FOREIGN PATENT DOCUMENTS

| | | |
|---|---|---|
| DE | 4202889 | 8/1993 |
| WO | WO 2007/141059 | 12/2007 |

OTHER PUBLICATIONS

Baunemann, A., "Tantalum complexes with all nitrogen coordination sphere: mixed amido-, imido-, guanidinato complexes of tantalum and their thermal behaviour", Dalton Trans, 2005, pp. 3051-3055.
Greenwood, N. N. et al., Chemistry of the Elements, $1^{st}$ edition, Pergamon Press, 1986.
Handbook of Thin Film Materials, vol. 1: Deposition and Processing of Thin films, Chapter 2, "Atomic Layer Deposition," Academic Press 2002, pp. 103-159.

(Continued)

*Primary Examiner* — Joseph Miller, Jr.
(74) *Attorney, Agent, or Firm* — Knobbe, Martens, Olson & Bear, LLP

(57) ABSTRACT

Atomic layer deposition (ALD) type processes for producing metal containing thin films comprise feeding into a reaction space vapor phase pulses of metal containing cyclopentadienyl precursors as a metal source material, wherein the metal is zirconium. In preferred embodiments the metal containing cyclopentadienyl reactant comprises a metal atom that is not directly bonded to an oxygen or halide atom. In other embodiments the metal atom is bonded to a cyclopentadienyl compound and separately bonded to at least one ligand via a nitrogen atom. In still other embodiments the metal containing cyclopentadienyl compound comprises a nitrogen-bridged ligand.

22 Claims, 1 Drawing Sheet

(56) References Cited

U.S. PATENT DOCUMENTS

| | | |
|---|---|---|
| 6,858,546 B2 | 2/2005 | Niinistö et al. |
| 6,863,727 B1 | 3/2005 | Elers et al. |
| 7,108,747 B1 | 9/2006 | Leskelä et al. |
| 7,713,592 B2 | 5/2010 | Nguyen et al. |
| 8,039,062 B2 | 10/2011 | Heys et al. |
| 8,399,056 B2 | 3/2013 | Blasco et al. |
| 8,470,402 B2 | 6/2013 | Dussarrat et al. |
| 8,568,530 B2 | 10/2013 | Heys et al. |
| 8,668,957 B2 | 3/2014 | Dussarrat et al. |
| 2001/0001949 A1 | 5/2001 | Westmoreland et al. |
| 2002/0010036 A1 | 1/2002 | Sullivan et al. |
| 2002/0192376 A1 | 12/2002 | Westmoreland et al. |
| 2003/0022457 A1 | 1/2003 | Gutsche et al. |
| 2003/0207540 A1 | 11/2003 | Ahn et al. |
| 2003/0215996 A1 | 11/2003 | Putkonen |
| 2004/0083963 A1 | 5/2004 | Dando et al. |
| 2004/0208994 A1 | 10/2004 | Harkonen et al. |
| 2005/0089632 A1 | 4/2005 | Vehkamaki et al. |
| 2005/0112874 A1 | 5/2005 | Skarp et al. |
| 2005/0164466 A1 | 7/2005 | Zheng et al. |
| 2006/0145142 A1 | 7/2006 | Norman |
| 2006/0219157 A1 | 10/2006 | Rahtu et al. |
| 2008/0107812 A1 | 5/2008 | Dussarrat et al. |
| 2012/0323008 A1 | 12/2012 | Barry et al. |

OTHER PUBLICATIONS

Jones, A.C. et al., "MOCVD and ALD of High-k Dielectric Oxides Using Alkoxide Precursors" Chem. Vap. Deposition, 2006, 12, pp. 83-98.

Leskela, M. "Atomic Layer Deposition (ALD): From Precursors to Thin Film Structures," Thin Solid Films, 409, 2002, p. 138.

Ma, K.T. Tin, et al.,"Guanidinate anions and dianions, Reactions involving alkylguanidines, (RNH)2CNR (R=i-Pr or Cy), and metal amido complexes $M(NMe_2)_5$ (M=Ta or Nb)," Journal of the Chemical Society, Dalton Transactions, p. 2947-2951, 1999.

Notice of Allowance from U.S. Appl. No. 10/696,591, Mailed Sep. 9, 2009.

Note on DE4202889: Foreign document and English Abstract Utilized.

Schuisky, M. "Atomic Layer CVD in the Bi—Ti—O System" Chem. Vap. Depo, V6, 2000, p. 139.

Structure from USPTO STIC/STN search related to U.S. Pat. No. 5,300,321 to Nakano.

Structure from USPTO STIC/STN search related to US Publication 2001/0001949 to Westmoreland.

Suntola, "Atomic Layer Epitaxy," Handbook of Crystal Growth 3, Ch. 14, pp. 601-663 (1994).

Wasslen, Yamile A. et al. "Synthesis and Thermolysis of Hafnium and Zirconium Guanidinates for Atomic Layer Deposition," Nov. 5, 2005; www.uwo.ca/chem/IDW/scientific/html.

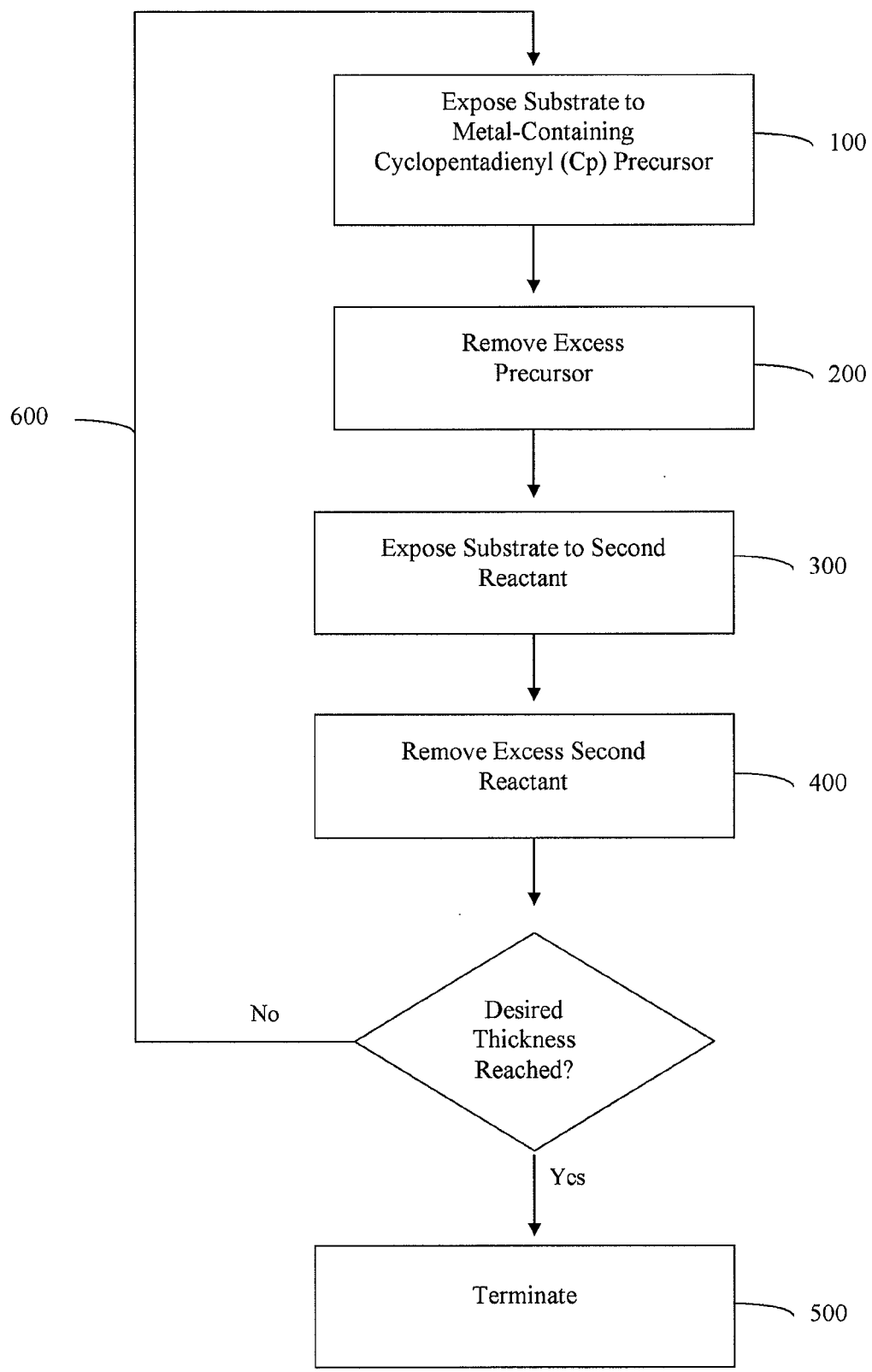

ALD OF ZIRCONIUM-CONTAINING FILMS USING CYCLOPENTADIENYL COMPOUNDS

REFERENCE TO RELATED APPLICATIONS

The present application is a continuation of U.S. patent application Ser. No. 11/588,595, filed Oct. 27, 2006, entitled "ALD OF METAL-CONTAINING FILMS USING CYCLOPENTADIENYL COMPOUNDS," the disclosure of which is hereby incorporated herein by reference in its entirety.

BACKGROUND OF THE INVENTION

1. Field of the Invention

This application relates generally to processes for depositing metal containing films. Certain embodiments relate to processes for manufacturing metal containing thin films by atomic layer deposition using volatile metal containing cyclopentadienyl compounds as source materials.

2. Description of the Related Art and Summary of the Invention

Atomic layer deposition ("ALD") refers to vapor deposition-type methods in which a material, typically a thin film, is deposited on a substrate from vapor phase reactants. It is based on sequential self-saturating surface reactions. ALD is described in detail, for example, in U.S. Pat. Nos. 4,058,430 and 5,711,811, incorporated herein by reference.

According to the principles of ALD, the reactants (also referred to as "source chemicals" or "precursors") are separated from each other, typically by inert gas, to prevent gas-phase reactions and to enable the self-saturating surface reactions. Typically, one of the precursors self-limitingly adsorbs largely intact, without thermal decomposition, while one of the precursors strips or replaces the ligands of the adsorbed layer. Surplus source chemicals and reaction by-products, if any, are removed from the reaction chamber by purging with an inert gas and/or evacuating the chamber before the next reactive chemical pulse is introduced. ALD provides controlled film growth as well as outstanding conformality. Various ALD recipes are possible with different reactants supplied in sequential pulses each with different functions, but the hallmark of ALD is self-limiting deposition.

Metal containing cyclopentadienyl compounds are technologically very important and have a variety of industrially useful properties. One such property is the ability for these compounds to adhere to both metals and nonmetals. Furthermore, without being bound to any theory, it is believed that the attached cyclopentadienyl ligand(s) contribute to overall compound stability. As a result, metal containing compounds can be used, for example, as precursors for forming adhesion layers in various structures including semiconductors, insulators, and ferroelectrics.

Metal containing films have previously been manufactured by physical vapor deposition (PVD) methods. These processes are well-known in the art. However, the PVD process has a number of drawbacks. For example, the PVD process is difficult or impossible to use for depositing thin film layers on complicated surfaces such as microelectronic surfaces with deep trenches and holes. In contrast, ALD processes can provide films of uniform quality and thickness.

Several different metal containing precursors have been previously used in ALD methods, but these precursors have a tendency to incorporate impurities into the growing thin film. For example, known processes utilizing metal chlorides, such as $TiCl_4$, and hydrogen plasma incorporate halide impurities into the resulting thin films. Similar concerns arise for known non-halide metal precursors such as metal containing alkoxides, like $Ti(OMe)_4$, where oxygen tends to remain in the film as an impurity.

As an alternative to the halide and oxide precursors, metal alkylamides, have been used in the art as precursors for ALD processes. However, these compounds suffer from thermal instability such that it can be difficult to find a deposition temperature that will not cause decomposition of the precursors and will keep the thin film atoms intact, but will still keep the precursors in vapor phase and provide the activation energy for the surface reactions.

In one aspect of the invention, atomic layer deposition (ALD) processes for producing metal containing thin films are provided. The processes preferably comprise alternately contacting a substrate in a reaction space with vapor phase pulses of at least one metal containing cyclopentadienyl precursor and at least one second reactant, such that a thin metal-containing film is formed on the substrate. In some embodiments, the metal containing cyclopentadienyl precursor comprises a metal atom that is not directly bonded to a halide or oxygen atom. In further embodiments, the metal atom is bonded to at least one cyclopentadienyl ligand and separately bonded to at least one ligand via nitrogen, wherein the ligands may comprise oxygenated or halogenated groups not directly bonded to the metal. In other embodiments the cyclopentadienyl precursor does not contain halide or oxygen atoms at all. In yet other embodiments, the metal containing cyclopentadienyl precursor comprises a nitrogen-bridged ligand.

In preferred embodiments, the metal containing cyclopentadienyl precursor comprises a metal selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir, more preferably from the group consisting of Ti, Zr, Hf, Ta, W, Nb, and Mo. In some embodiments, the metal containing cyclopentadienyl precursor comprises a metal with a trivalent oxidation state.

In another aspect of the invention, ALD processes for forming an elemental metal thin film are provided. The processes preferably comprise alternately contacting a substrate with a metal containing cyclopentadienyl precursor as described above and a second reactant such that an elemental metal thin film is formed on the substrate. In some embodiments, the second reactant is selected from hydrogen or hydrogen plasma. The cycles are repeated until a thin film of the desired thickness has been deposited.

In another aspect of the invention, ALD processes for forming a metal nitride thin film are provided. The processes preferably comprise alternately contacting a substrate with a metal containing cyclopentadienyl reactant as provided above and a second nitrogen containing reactant such that a metal nitride thin film is formed on the substrate. In some embodiments, the second reactant is selected from $NH_3$, $N_2$ plasma, $N_2/H_2$ plasma, hydrazine, and/or hydrazine derivatives.

In another aspect of the invention, an atomic layer deposition process for forming a metal carbide thin film comprises alternately contacting a substrate with a metal containing cyclopentadienyl precursor as provided above and second carbon containing reactant such that a metal carbide thin film is formed on the substrate. In some embodiments, the carbon source is a hydrocarbon such as an alkane, alkene, and/or alkyne. In other embodiments, the carbon containing compound preferably comprises a central atom selected from group B, Al, Ga, In, Si, Ge, Sn, P, As, or S.

In another aspect, multicomponent thin films are deposited by atomic layer deposition processes. The processes preferably comprise at least two growth sub-cycles with the first sub-cycle comprising contacting a substrate with alternate and sequential vapor phase pulses of a first metal precursor and a first reactant, and then a second sub-cycle comprising contacting the substrate with alternate and sequential vapor phase pulses of a second metal precursor and a second reactant. In some embodiments the second metal precursor is different from the first metal precursor. For example, the second metal precursor may comprise a different metal from the first metal precursor. In other embodiments the second reactant is different from the first reactant. For example, the first and second reactants may contribute different species, such as N, C, or O to the growing film. In at least one of the growth sub-cycles the metal precursor is a metal containing cyclopentadienyl precursor as described above. The sub-cycles may be repeated in equivalent numbers. However, in some embodiments the ratio of the sub-cycles is varied to achieve the desired film composition, as will be apparent to the skilled artisan.

In another aspect, a multicomponent thin film comprises at least one elemental metal layer whereby at least one of the growth sub-cycles comprises contacting a substrate with alternate and sequential vapor phase pulses of a metal containing cyclopentadienyl precursor and a reactant. In some embodiments, the reactant is selected from hydrogen and hydrogen plasma.

In another aspect, a multicomponent thin film comprising at least one metal nitride layer is deposited by atomic layer deposition type processes. The processes preferably comprise at least one sub-cycle of alternating and sequential pulses of a metal containing cyclopentadienyl precursor and a nitrogen containing reactant. In some embodiments the nitrogen containing material is selected from the group consisting of $NH_3$, $N_2$ plasma, $N_2/H_2$ plasma, hydrazine, and hydrazine derivatives.

In another aspect, a multicomponent thin film comprising at least one metal carbide layer is deposited by atomic layer deposition type processes. The processes preferably comprise at least one sub-cycle of alternating and sequential pulses of a metal containing cyclopentadienyl precursor and a carbon source material. In some embodiments the carbon source material is a hydrocarbon. In other embodiments, the hydrocarbon is selected from alkanes, alkenes, and alkynes. The carbon containing compound may be one with a central atom selected from group B, Al, Ga, In, Si, Ge, Sn, P, As, or S.

The disclosed ALD processes preferably comprise at least one sub-cycle comprising alternating and sequential pulses of a metal containing cyclopentadienyl precursor. Preferably, the metal containing cyclopentadienyl precursor comprises at least one cyclopentadienyl ligand and a metal that is not directly bonded to a halide or oxygen atom. Alternatively, the metal precursor comprises at least one cyclopentadienyl ligand and at least one ligand that is separately bonded to the metal via nitrogen, wherein each ligand may contain oxygenated or halogenated groups not directly bonded to the metal. In some preferable embodiments, at least one chelating ligand, such as a bidentate ligand, is bonded to the metal via nitrogen. Additionally, the metal containing cyclopentadienyl precursor may comprise a nitrogen-bridged ligand. In some embodiments the precursor does not comprise any oxygen or halide atoms.

Preferably, the metal precursor is selected from $(R^1R^2R^3R^4R^5Cp)_x$-$MR^O_z$)—$(R^6)_y$, $R^1R^2R^3R^4R^5Cp)_x$-$MR^O_z$—$(NR^1R^2)_y$, $(R^1R^2R^3R^4R^5Cp)_x$-$MR^O_z$—$(NR^1NR^2R)_y$, and $(R^1R^2R^3R^4R^5Cp)_x$-$MR^O_z$-$[(NR^1NR^2)CNR^3]_y$, $(R^1R^2R^3R^4R^5Cp)_x$-$MR^O_z$-$[(NR^1NR^2)CNR^3R^4]_y$. The metal containing cyclopentadienyl precursor may be, for example, a titanium cyclopentadienyl compound having the formulas described. In some embodiments the precursor is biscyclopentadienyl triisopropylguanidinato titanium (III).

Preferably the substrate temperature is higher than the evaporation temperature of the precursor and lower than the decomposition temperature of the precursor.

BRIEF DESCRIPTION OF THE DRAWINGS

FIG. 1 is a flow chart showing a typical process flow according to some preferred embodiments.

DETAILED DESCRIPTION OF THE PREFERRED EMBODIMENT

Stable metal containing precursors that have thermal stability yet avoid possible contamination problems are desirable for ALD processes. As discussed below, metal cyclopentadienyl compounds with the particular characteristics described herein have been found to be good metal precursors for depositing metal containing thin films by ALD because these compounds avoid many of the problems associated with the use of previously known metal precursors.

In context of the present invention, "an ALD type process" generally refers to a process for depositing thin films on a substrate molecular layer by molecular layer. This controlled deposition is made possible by self-saturating chemical reactions on the substrate surface. Vapor phase reactants are conducted alternately and sequentially into a reaction chamber and contacted with a substrate located in the chamber to provide a surface reaction. Typically, a pulse of a first reactant is provided to the reaction chamber where it chemisorbs on the substrate surface in a self-limiting manner. Any excess first reactant (and reactant byproducts, if any) is then removed and a pulse of a second reactant is provided to the reaction chamber. The second reactant reacts with the adsorbed first reactant, also in a self-limiting manner. Excess second reactant and reaction by-products, if any, are removed from the reaction chamber. Additional reactants may be supplied in each ALD cycle, depending on the composition of the thin film being deposited. This cycle is repeated to form a metal containing thin film of desired thickness.

The pressure and the temperature of the reaction chamber are adjusted to a range where physisorption (i.e., condensation of gases) and thermal decomposition of the precursors are avoided. Consequently, only up to one monolayer (i.e., an atomic layer or a molecular layer) of material is deposited at a time during each pulsing cycle. The actual growth rate of the thin film, which is typically presented as Å/pulsing cycle, depends, for example, on the number of available reactive surface sites on the surface and bulkiness of the reactant molecules.

Gas phase reactions between precursors and any undesired reactions with reaction by-products, if any, are preferably inhibited or prevented to maintain self-limiting behavior and minimize contamination. Reactant pulses are separated from each other and the reaction chamber is purged with the aid of an inactive gas (e.g. nitrogen or argon) and/or evacuated between reactant pulses to remove surplus gaseous reactants and reaction by-products from the chamber. The principles of ALD type processes are discussed e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

An extensive description of ALD precursors and ALD-grown materials can be found in the Handbook of Thin Film Materials, Vol. 1: Deposition and Processing of Thin Films, Chapter 2 "Atomic Layer Deposition", pp. 103-159, Academic Press 2002, incorporated by reference herein.

In the context of the present application "a reaction space" designates generally a reaction chamber, or a defined volume therein, in which the conditions can be adjusted so that deposition of a thin film is possible.

In the context of the present application, "an ALD type reactor" is a reactor where the reaction space is in fluid communication with an inactive gas source and at least one, preferably at least two precursor sources such that the precursors can be pulsed into the reaction space. The reaction space is also preferably in fluid communication with a vacuum generator (e.g. a vacuum pump), and the temperature and pressure of the reaction space and the flow rates of gases can be adjusted to a range that makes it possible to grow thin films by ALD type processes. The reactor also includes the mechanism, such as valves and programming, to pulse and maintain separation between the reactants.

As is well known in the art, there are a number of variations of the basic ALD method, including PEALD (plasma enhanced ALD) in which plasma is used for activating reactants. Conventional ALD or thermal ALD refers to an ALD method where plasma is not used but where the substrate temperature is high enough for overcoming the energy barrier (activation energy) during collisions between the chemisorbed species on the surface and reactant molecules in the gas phase so that up to a molecular layer of thin film grows on the substrate surface during each ALD pulsing sequence or cycle. As used herein, the term "ALD" covers both PEALD and thermal ALD.

"Metal source material" and "metal precursor" are used interchangeably to designate a volatile or gaseous metal compound that can be used in an ALD process and contributes metal to a deposited film.

The term "multicomponent thin film" covers thin films comprising at least two different metal atoms.

According to preferred embodiments, metal containing thin films are deposited by ALD using metal containing cyclopentadienyl precursors. In some embodiments, the metal containing cyclopentadienyl precursor comprises a metal selected from the group consisting of Ti, Zr, Hf, Ta, W, Nb, and Mo. In other embodiments, the metal has a trivalent oxidation state. In further embodiments, the trivalent metal is selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir.

Preferably, the metal containing cyclopentadienyl (Cp) precursor comprises at least one cyclopentadienyl ligand and does not contain halide or oxygen atoms. However, in other embodiments the metal precursor may contain halide or oxygen atoms not directly bonded to the metal. In still other embodiments the precursor contains at least one cyclopentadienyl ligand and at least one ligand that is bonded to the metal via nitrogen, wherein each ligand may contain oxygen or halogen groups not directly bonded to the metal. In some embodiments, the precursor may contain nitrogen-bridged ligands. Exemplary recursors can be selected from the group consisting of compounds according to Formulae I-VII as described below.

The general formula for a metal precursor comprising at least one cyclopentadienyl ligand can be written according to Formula I:

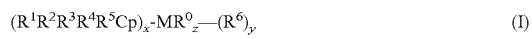   (I)

wherein M is a metal preferably selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir, wherein each $R^1$, $R^2$, $R^3$, $R^4$, $R^5$, and $R^0$ is independently selected from:

i. hydrogen;

ii. linear and branched $C_1$-$C_{20}$ alkyl, alkenyl and alkynyl groups, which are independently substituted or unsubstituted;

iii. carbocyclic groups, such as aryl, preferably phenyl, cyclopentadienyl, alkylaryl, and halogenated carbocyclic groups; and iv. heterocyclic groups;

wherein $R^6$ is independently selected from:

i. hydrogen;

ii. linear and branched $C_1$-$C_{20}$ alkyl, alkenyl and alkynyl groups, which are independently substituted or unsubstituted;

iii. carbocyclic groups, such as aryl, preferably phenyl, cyclopentadienyl, alkylaryl, and halogenated carbocyclic groups;

iv. heterocyclic groups; and v. $NR^1R^2$; and wherein both x and y are ≥1 and z≥0.

In some embodiments, the metal containing cyclopentadienyl compound comprises at least one ligand that is bonded to the metal via nitrogen as depicted by Formula II:

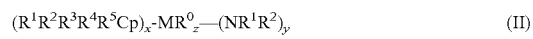   (II)

wherein M is a metal preferably selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir, wherein each $R^1$, $R^2$, $R^3$, $R^4$, $R^5$, and $R^0$ is independently selected from:

i. hydrogen;

ii. linear and branched $C_1$-$C_{20}$ alkyl, alkenyl and alkynyl groups, which are independently substituted or unsubstituted;

iii. carbocyclic groups, such as aryl, preferably phenyl, cyclopentadienyl, alkylaryl, and halogenated carbocyclic groups; and iv. heterocyclic groups; and wherein both x and y are ≥1 and z≥0.

In Formula II, the alkyl, alkenyl and alkynyl groups can be selected from any linear or branched alkyl, alkenyl and alkynyl groups which have 1 to 20 carbon atoms, preferably 1 to 10 carbon atoms, in particular 1 to 6 carbon atoms. Examples of such alkyl groups include methyl; ethyl; n- and i-propyl-; n-, i- and t-butyl-; n- and isoamyl; n- and isopentyl; n- and isohexyl; and 2,3-dimethyl-2-butyl. In some embodiments, alkyl groups are preferred. In other embodiments, the $C_{1-20}$, preferably $C_{1-10}$, in particular $C_{1-6}$, alkenyl and alkynyl groups include the corresponding groups having a corresponding degree of unsaturation.

Preferably, the metal containing cyclopentadienyl precursor is a compound having at least one cyclopentadienyl ligand and at least one chelating ligand, for example, a bidentate ligand. In some embodiments, this compound is depicted by Formula III, $(R^1R^2R^3R^4R^5Cp)_x$-$MR^0{}_z$—$(NR^1NR^2R)_y$, as follows:

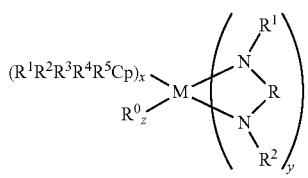

(III)

wherein M is a metal preferably selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir;

wherein R can be any linear and branched $C_1$-$C_{20}$ alkyl, alkenyl and alkynyl groups, which are independently substituted or unsubstituted and R can be bonded to two bridging nitrogen atoms any point of alkyl, alkenyl and alkynyl groups;

wherein each $R^1$, $R^2$, $R^3$, $R^4$, $R^5$, and $R^0$ is independently selected from:
  i. hydrogen;
  ii. linear and branched $C_1$-$C_{20}$ alkyl, alkenyl and alkynyl groups, which are independently substituted or unsubstituted;
  iii. carbocyclic groups, such as aryl, preferably phenyl, cyclopentadienyl, alkylaryl, and halogenated carbocyclic groups; and
  iv. heterocyclic groups; and wherein both x and y are ≥1 and z≥0.

In other preferable embodiments, the metal containing cylcopentadienyl precursor is depicted by Formula IV, $(R^1R^2R^3R^4R^5Cp)_x$-$MR^0_z$—$[(NR^1NR^2)CNR^3]_y$, as follows:

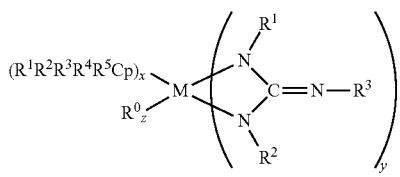

(IV)

wherein M is a metal, preferably selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir;

wherein each $R^1$, $R^2$, $R^3$, $R^4$, $R^5$, and $R^0$ is independently selected from
  i. hydrogen;
  ii. linear and branched $C_1$-$C_{20}$ alkyl, alkenyl and alkynyl groups, which are independently substituted or unsubstituted;
  iii. carbocyclic groups, such as aryl, preferably phenyl, cyclopentadienyl, alkylaryl, and halogenated carbocyclic groups; and
  iv. heterocyclic groups; and wherein both x and y are ≥1 and z≥0.

In further preferable embodiments, the metal containing cyclopentadienyl precursor is depicted by Formula V, $(R^1R^2R^3R^4R^5Cp)_x$-$MR^0_z$-$[(NR^1NR^2)CNR^3R^4]_y$, as follows:

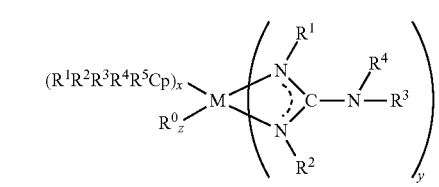

(V)

Al, Ga, In, Sc, Ti, V, Cr, Mn, Fe, Co, Ni, Y, Zr, Nb, Mo, Tc, Ru, Rh, La, Hf, Ta, W, Re, Os, and Ir wherein M is a metal, preferably selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir;

wherein each $R^1$, $R^2$, $R^3$, $R^1$, $R^5$, and $R^0$ is independently selected from:
  i. hydrogen;
  ii. linear and branched $C_1$-$C_{20}$ alkyl, alkenyl and alkynyl groups, which are independently substituted or unsubstituted;
  iii. carbocyclic groups, such as aryl, preferably phenyl, cyclopentadienyl, alkylaryl, and halogenated carbocyclic groups; and
  iv. heterocyclic groups; and wherein both x and y are ≥1 and z≥0.

In a particular example, the metal containing cyclopentadienyl precursor is biscyclopentadienyl triisopropylguanidinato titanium (III) as depicted by Formula VI:

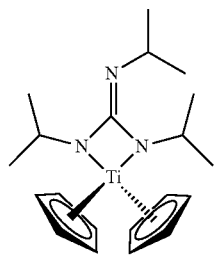

(VI)

In further embodiments, the metal containing cyclopentadienyl compound as described in Formulae I-VI may comprise $R^0$, $R^1$, $R^2$, $R^3$, $R^4$, $R^5$, and $R^6$ wherein each is independently selected from
  i. hydrogen;
  ii. linear and branched $C_1$-$C_{20}$ alkyl, alkenyl and alkynyl groups, which are independently substituted or unsubstituted;
  iii. carbocyclic groups, such as aryl, preferably phenyl, cyclopentadienyl, and alkylaryl; and
  iv. heterocyclic groups Optionally, a metal containing cyclopentadienyl compound as described may comprise modified cyclopentadienyl groups. In some embodiments, the modified cyclopentadienyl groups are selected from the group consisting of $Me_5Cp$, MeCp, EtCp, and $Me_3SiCp$. In further embodiments, the metal containing cyclopentadienyl compound may comprise an anionic or dianionic guanidinate ligand such as a triisopropylguanidinate ligand.

As illustrated in FIG. 1, in a preferred ALD type process, a gas phase pulse of first reactant, a metal containing cyclopentadienyl compound (100) is introduced into the reaction space of an ALD reactor, where it is contacted with a suitable substrate. No more than a monolayer of the metal precursor adsorbs on the substrate surface in a self-limiting manner. Excess metal precursor is removed from the reaction space by purging and/or evacuating the chamber (200).

Subsequently, a gas phase pulse of a second reactant is introduced into the reaction space (300), where it reacts with the adsorbed metal precursor in a self-limiting manner. The second reactant will be selected based on the nature of the metal containing film being deposited. For forming a metal containing film, the second reactant may strip ligands from the adsorbed species. In the case of a compound film the second reactant may also contribute to the film, for example it may contribute carbon (to form a metal carbide film) or nitrogen (to form metal nitride film). Thus, the film may comprise a single metal species or, through the use of multiple reactants, a combination of species, for example one or more metal species, nitrogen, carbon .etc. . . . . .

After sufficient time for it to react with the adsorbed first reactant, the second reactant is removed from the reaction space (400). If a thin film of a desired thickness has been formed, the process may be terminated (500). However, if additional deposition is desired, the cycle may be begun again (600). As discussed below, subsequent cycles may or may not be identical to the previous cycle.

By alternating the provision of the metal precursor and the second reactant, a metal containing thin film of the desired composition and thickness can be deposited. A growth rate of about from 0.1 to 1.5 Å/cycle is typically achieved in ALD processes. Growth rates and suitable growth temperatures depend, in part, upon the metal precursor chosen and can be readily determined by the skilled artisan.

Optionally, an inactive gas can be used as a carrier gas during deposition. Inactive gas may also be used to purge the reaction chamber of excess reactant and reaction by-products, if any, between reactant pulses.

The deposition can be carried out at normal pressure, but it is preferred to operate the process at reduced pressure. Thus, the pressure in the reactor is typically from about 1 to about 100 mbar, preferably from 5 to about 50 mbar.

The reaction temperature can be varied depending, in part, on the evaporation temperature and the decomposition temperature of the precursor. In some embodiments, the range is from about 20° C. to about 500° C., preferably from about 100° C. to about 400° C., more preferably from about 200° C. to about 400° C. The substrate temperature is preferably low enough to keep the bonds among thin film atoms intact and to prevent thermal decomposition of the gaseous reactants. On the other hand, the substrate temperature is preferably high enough to keep the source materials in gaseous phase and avoid condensation. Further, the temperature is preferably sufficiently high to provide the activation energy for the surface reaction.

The substrate can be of various types. Examples include, without limitation, silicon, silica, coated silicon, germanium, silicon-germanium alloys, copper metal, noble metals group (including silver, gold, platinum, palladium, rhodium, iridium and ruthenium), nitrides, such as transition nitrides, e.g. tantalum nitride TaN, carbides, such as transition carbides, e.g. tungsten carbide WC, and nitride carbides, e.g. tungsten nitride carbide $WN_xC_y$. The preceding thin film layer deposited on the substrate, if any, will form the substrate surface for the next thin film.

Formation of a Elemental Metal Thin Film

According to some embodiments, a metal containing cyclopentadienyl compound as described above, preferably one wherein the metal is not directly bonded to a halide or oxygen atom, is used to produce an elemental metal thin film. The metal precursor may be selected from compounds according to Formulae I-VI as described above. In some embodiments, the elemental metal thin film is deposited by alternately and sequentially contacting the substrate with the metal containing cyclopentadienyl compound and a second reactant to deposit an elemental metal thin film. In some embodiments, the second reactant is hydrogen or hydrogen plasma. In some particular embodiments, the metal precursor is a titanium cyclopentadienyl compound.

Formation of a Metal Nitride Thin Film

According to the preferred embodiments, a metal containing cyclopentadienyl precursor as described above, preferably wherein the metal is not directly bonded to a halide or oxygen atom, can be used to produce a metal nitride thin film. The metal precursor may be selected from compounds according to Formulae I-VI as described above. The metal containing cyclopentadienyl reactant is provided to the reaction space alternately and sequentially with a nitrogen source material. In some such embodiments the nitrogen source material may be selected from the group consisting of $NH_3$, $N_2$ plasma, $N_2/H_2$ plasma, hydrazine, and/or hydrazine derivatives. In some particular embodiments a titanium nitride thin film is deposited.

Formation of a Metal Carbide Thin Film

A metal containing cyclopentadienyl precursor as provided above, preferably wherein the metal is not directly bonded to a halide or oxygen atom, can also be used in conjunction with a carbon compound to produce a metal carbide thin film. Preferably the metal precursor is selected from compounds according to Formulae I-VI as described above and is provided alternately and sequentially with a second carbon-contributing reactant in an ALD process. In some embodiments, the carbon compound is a hydrocarbon. In some such embodiments the hydrocarbon is selected from alkanes, alkenes, and alkynes. Additionally, in some embodiments, the carbon containing compound is one with a central atom selected from group B, Al, Ga, In, Si, Ge, Sn, P, As, or S. In some particular embodiments, the metal containing precursor is a titanium cyclopentadienyl compound and the metal carbide thin film is a titanium carbide thin film.

Formation of a Multicomponent Thin Film

In order to produce multicomponent thin films, at least one additional metal source material can be introduced to the ALD process. In some preferred embodiments, each additional metal source material is provided in a separate pulse, with each cycle comprising feeding a vapor phase pulse of an additional metal source material, removing excess additional metal source material, providing a vapor phase pulse of a reactant, and removing excess reactant. The same said reactant may be provided after each of the two or more different metal source material, or different reactants (e.g., reducing agents, carbon sources, and/or nitrogen sources) may be used to react with different metal precursors. The number of cycles for each metal precursor may be equivalent or may be different, depending on the composition of the film that is desired.

In other embodiments, a multicomponent thin film is deposited by ALD processes with at least two growth sub-cycles comprising a first sub-cycle involving feeding a vapor phase pulse of a first metal containing precursor, removing excess first metal containing precursor, providing a vapor phase pulse of a first reactant, removing excess first reactant; then a second sub-cycle involving feeding a vapor phase pulse of a second metal containing precursor, removing excess second metal containing precursor, providing a vapor phase pulse of a second reactant, and then removing excess second reactant. In some embodiments, a third, fourth, fifth etc. . . . . metal compound is used, typically in additional sub-cycles. The ratio of subcycles can be selected depending on the desired thin film composition. At least one sub-cycle deposits a different material from another sub-cycle. A metal containing cyclopentadienyl precursor as described above is used a the metal containing precursor in at least one subcycle.

In some embodiments, ALD processes for producing a multicomponent thin film comprise at least one elemental metal sub-cycle. The processes preferably comprise contacting a substrate with alternate and sequential vapor phase pulses of a metal precursor and a reactant. The first reactant may be selected from hydrogen or hydrogen plasma. The metal precursor is preferably a metal containing cyclopentadienyl compound as described above. The metal containing cyclopentadienyl may be, for example, selected from the compounds having Formulae I-VI as described.

In other embodiments, ALD processes for producing a multicomponent thin film comprise at least one metal nitride sub-cycle. The processes preferably comprise contacting a substrate with alternate and sequential vapor phase pulses of a metal precursor and a reactant. In some embodiments the metal precursor is preferably a metal containing cyclopentadienyl compound as described above. In some embodiments the nitrogen containing material is selected from the group consisting of $NH_3$, $N_2$ plasma, $N_2/H_2$ plasma, hydrazine, and/or hydrazine derivatives. In some embodiments, the metal containing cyclopentadienyl may be selected from the compounds having Formulae I-VI as described.

In another embodiment, multicomponent thin film deposition processes comprising at least one metal carbide sub-cycle are conducted by atomic layer deposition type processes. These sub-cycles preferably comprise contacting a substrate with alternate and sequential vapor phase pulses of a metal precursor and a carbon source material, where the metal precursor is preferably a metal containing cyclopentadienyl compound as described above. In some embodiments, the carbon source material is a hydrocarbon, preferably a hydrocarbon selected from alkanes, alkenes, and alkynes. Additionally, in further embodiments, the carbon containing compound is one with a central atom selected from group B, Al, Ga, In, Si, Ge, Sn, P, As, or S. Additionally, the metal containing cyclopentadienyl may be selected from the compounds having Formulae I-VI as described.

In other embodiments, a pulse of an additional metal precursor is the second source material provided after the first metal precursor in the same deposition cycle. A first reactant is then provided to convert the two metals into the desired type of thin film. Additional metal precursors may also be provided prior to provision of a reactant. In other embodiments, a reactant is provided after each metal source precursor, as discussed above.

In addition, in some embodiments, the additional metal compound is provided in each ALD cycle. That is, a pulse of the second metal compound is provided for each pulse of the first metal precursor. However, in other embodiments, the second metal compound is provided intermittently in a selected ratio to the first metal precursor pulses in the deposition process. Preferably, at least one of the metal precursors, for the disclosed ALD processes, is a metal containing cyclopentadienyl compound as described above, such as a titanium cyclopentadienyl compound.

Although referred to as the "first" reactant or metal precursor, the "second," and "third" etc., these labels are for convenience and do not indicate the actual order of the metal source materials or reactants. Thus, the initial ALD cycle may be started with any of the phases described above. However, one of skill in the art will recognize that if the initial ALD cycle does not begin with the metal source phase, at least two ALD cycles will typically need to be completed to begin deposition of the desired thin film. As is well-known in the art, typically less than a monolayer of a material is deposited in each ALD cycle due, in part, to steric hindrance and the availability of reactive sites on the substrate surface.

At least one of the additional metal precursors can be metal compounds comprising a single metal or complex metal compounds comprising two or more metals. In some embodiments, the metal compounds comprise at least one metal selected from the group consisting of Al, Ga, In, Sc, Ti, V, Cr, Mn, Fe, Co, Ni, Y, Zr, Nb, Mo, Tc, Ru, Rh, La, Hf, Ta, W, Re, Os, and Ir. In other embodiments at least one metal is a trivalent metal.

Since the properties of the metal compounds vary, the suitability of each metal compound for use in the ALD processes disclosed herein has to be considered. The properties of the compounds can be found, e.g., in N. N. Greenwood and A. Earnshaw, *Chemistry of the Elements*. $1^{st}$ edition, Pergamon Press, 1986. The suitability of any particular compound can readily be determined by a skilled artisan.

The novel thin film deposition processes will find extensive application as semiconductors, insulators and ferroelectrics. For example, the films formed according to preferred methods may define, e.g., diffusion barriers in integrated circuits, metal gates in transistors, or metal electrodes in capacitor structures. In some embodiments, metal nitride films may serve as top/bottom electrodes for MIM/MIS capacitors, such as eDRAM, DRAM, RF decoupling, and planar and 3-D capacitors.

In other embodiments, metal carbide films can be formed as a component of an integrated circuit, such as, e.g., a conductive diffusion barrier forming a part of a line in a dual damascene structure, a metal gate electrode, such as an NMOS gate electrode, or an anti-reflective coating. In other embodiments, the metal carbide film may form a part of hard coating on a substrate to protect against mechanical wear, or may be used as a component of a corrosion protection layer. In still other embodiments, the metal carbide film can be, e.g., used as part of a chemical reaction catalyst or as an etch stop barrier.

The metal containing cyclopentadienyl precursors described herein for use in ALD processes not only lack many of the problems associated with thermal instability, but also provides for better film uniformity by avoiding oxygen and halide contamination.

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

What is claimed is:

1. A plasma enhanced atomic layer deposition process for producing a metal containing thin film on a substrate comprising alternately and sequentially contacting the substrate with vapor phase pulses of at least one volatile metal containing cyclopentadienyl compound, and a second reactant at a temperature that is low enough to prevent decomposition of the metal containing cyclopentadienyl compound and the second reactant, wherein the metal comprises zirconium, and wherein the metal containing cyclopentadienyl compound does not contain a metal directly bonded to a halide or oxygen atom, and wherein the metal containing cyclopentadienyl compound comprises at least one cyclopentadienyl bonded to the metal and at least one ligand that is separately bonded to the metal via nitrogen.

2. The process of claim 1, wherein the metal containing cyclopentadienyl compound has the formula: $(R^1R^2R^3R^4R^5Cp)_x\text{-}MR^0_z\text{---}(NR^1R^2)_y$, wherein M is zirconium;

wherein each $R^1$, $R^2$, $R^3$, $R^4$, $R^5$, and $R^0$ is independently selected from:

(i) hydrogen;

(ii) linear and branched $C_1$-$C_{20}$ alkyl, alkenyl and alkynyl groups, which are independently substituted or unsubstituted;

(iii) carbocyclic groups, such as aryl, phenyl, cyclopentadienyl, alkylaryl, and halogenated carbocyclic groups; and (iv) heterocyclic groups; and wherein both x and y are ≥1 and z ≥0.

3. The process of claim 2, wherein each of the $R^1$ and $R^2$ is independently selected from methyl, ethyl, n-propyl, i-propyl, n-butyl, i-butyl, t-butyl, n-amyl, isoamyl, n-pentyl, isopentyl, n-hexyl, isohexyl, and 2,3-dimethyl-2-butyl.

4. The process of claim 2, wherein each of the $R^1$ and $R^2$ is independently selected from linear and branched $C_1$-$C_4$ alkyl, alkenyl, and alkynyl groups, which are independently substituted or unsubstituted.

5. The process of claim 4, wherein each of the $R^1$ and $R^2$ is independently selected from linear and branched $C_1$-$C_4$ alkyl, which are independently substituted or unsubstituted.

6. The process of claim 2, wherein z is 0.

7. The process of claim 6, wherein y is 3.

8. The process of claim 1, wherein the metal containing cyclopentadienyl compound does not comprise halide or oxygen atoms.

9. The process of claim 1, wherein the metal containing thin film comprises an insulator material.

10. The process of claim 1, wherein the temperature is 200° C. to 400° C.

11. An atomic layer deposition process for producing a metal containing thin film on a substrate comprising sequentially:

contacting the substrate with a vapor pulse of a first reactant, wherein the first reactant comprises a metal containing cyclopentadienyl compound, wherein the metal containing cyclopentadienyl compound does not contain a metal directly bonded to a halide or oxygen atom, and wherein the metal containing cyclopentadienyl compound has the formula: $(R^1R^2R^3R^4R^5Cp)_x\text{---}MR^0_{z\text{---}(NR}{}^1R^2)_y$ wherein M is zirconium;

wherein each $R^1$, $R^2$, $R^3$, $R^4$, $R^5$, and R is independently selected from:

(i) hydrogen, (ii) linear and branched $C_1$-$C_{20}$ alkyl, alkenyl and alkynyl groups, which are independently substituted or unsubstituted, and wherein both x and y are ≥1 and z ≥0; and contacting the substrate with a second reactant.

12. The process of claim 11, wherein an inert gas serves as a carrier gas for the first reactant.

13. The process of claim 11, wherein the atomic layer deposition process comprises a plasma enhanced atomic layer deposition process.

14. The process of claim 11, wherein each of the $R^1$ and $R^2$ is independently selected from linear and branched $C_1$-$C_4$ alkyl, alkenyl, and alkynyl groups, which are independently substituted or unsubstituted.

15. The process of claim 14, wherein each of the $R^1$ and $R^2$ is independently selected from linear and branched $C_1$-$C_4$ alkyl, which are independently substituted or unsubstituted.

16. The process of claim 15, wherein each of the $R^1$ and $R^2$ is independently selected from methyl, ethyl, n-propyl, i-propyl, n-butyl, i-butyl, and t-butyl.

17. The process of claim 11, wherein z is 0.

18. The process of claim 17, wherein y is 3.

19. The process of claim 11, wherein the metal containing cyclopentadienyl compound does not comprise halide or oxygen atoms.

20. The process of claim 11, wherein the metal containing cyclopentadienyl compound comprises a modified cyclopentadienyl group.

21. The process of claim 20, wherein the modified cyclopentadienyl group is selected from the group consisting of $Me_5Cp$, MeCp, EtCp, and $Me_3SiCp$.

22. The process of claim 11, wherein the metal containing thin film comprises an insulating thin film.

* * * * *